US006563168B2

United States Patent
Lee (10) Patent No.: US 6,563,168 B2
(45) Date of Patent: May 13, 2003

(54) NON-VOLATILE SEMICONDUCTOR DEVICE WITH ANTI-PUNCH THROUGH REGIONS

(75) Inventor: Yong-Kyu Lee, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/989,113

(22) Filed: Nov. 21, 2001

(65) Prior Publication Data

US 2002/0052080 A1 May 2, 2002

Related U.S. Application Data (62) Division of application No. 09/349,728, filed on Jul. 8, 1999, now Pat. No. 6,348,378.

(30) Foreign Application Priority Data

Jul. 10, 1998 (KR) .............................................. 98-27833

(51) Int. Cl.⁷ ...................... H01L 29/788; H01L 29/792
(52) U.S. Cl. ....................................... 257/316; 257/326
(58) Field of Search ................................. 257/316, 326

(56) References Cited

U.S. PATENT DOCUMENTS

| 4,471,373 | A | * | 9/1984 | Shimizu et al. .............. 257/315 |
| 5,057,448 | A | * | 10/1991 | Kuroda ........................ 438/241 |
| 5,311,049 | A | * | 5/1994 | Tsuruta ........................ 257/324 |
| 5,366,915 | A | | 11/1994 | Kodama et al. |
| 5,395,773 | A | * | 3/1995 | Ravindhran et al. ......... 438/217 |
| 5,592,415 | A | * | 1/1997 | Kato et al. .............. 365/185.01 |
| 5,656,522 | A | | 8/1997 | Komori et al. |
| 5,712,178 | A | | 1/1998 | Cho et al. |
| 5,793,088 | A | * | 8/1998 | Choi et al. ................... 257/335 |
| 5,915,178 | A | | 6/1999 | Chiang et al. |
| 6,023,085 | A | * | 2/2000 | Fang ........................... 257/261 |
| 6,284,603 | B1 | | 9/2001 | Simon et al. |

* cited by examiner

*Primary Examiner*—Wael Fahmy
*Assistant Examiner*—Howard Weiss
(74) *Attorney, Agent, or Firm*—Lee & Sterba, P.C.

(57) ABSTRACT

A non-volatile semiconductor device and a method of making such a device having a memory cell formation part and a peripheral circuit part having high and low-voltage transistor formation parts, wherein the device includes an anti-punch through region surrounding a drain region in the memory cell formation part, and surrounding drain and source regions of the low-voltage transistor formation part.

2 Claims, 8 Drawing Sheets

NON-VOLATILE SEMICONDUCTOR DEVICE WITH ANTI-PUNCH THROUGH REGIONS

This application is a divisional application of co-pending application Ser. No. 09/349,728, filed Jul. 8, 1999, now U.S. Pat. No. 6,348,378.

BACKGROUND OF THE INVENTION

1. Field of the Invention

The present invention relates to a non-volatile semiconductor device and to a method of making a non-volatile semiconductor device. The invention provides a reduced program disturbance caused by a punch-through that may occur while programming a selected cell. The invention also ensures an adequate amount of on-cell current thereby facilitating an appropriate and accurate on/off sensing decision.

2. Description of the Related Art

Non-volatile semiconductor devices having a flash memory cell are able to delete and/or store data electronically, and are capable of storing data even without power. These devices therefore are attaining a wide-spread applicability in a variety of technical fields. Among these devices, the NOR-type non-volatile semiconductor device, which is generally related to the present invention, typically is structured to have a plurality of memory cell transistors connected in parallel to a bit line. The NOR-type devices usually have only one transistor connected between a drain and a source, which also are connected to the bit line. This configuration increases the memory cell current and enables a high speed operation.

Because the memory cell is connected to the bit line in parallel, the cells adjacent to a common bit line are over-deleted, or inadvertently deleted, when reading the selected cell. In addition, if the threshold voltage (Vth) of the memory cell transistor becomes lower (for example, 0V) than the voltage applied to the control gate of a non-selected cell, a malfunction (read-disturbance) occurs. The malfunction occurs because current flows regardless of whether the selected cell is in the on or off (on/off) position, and thus, all of the cells are read as on-cells.

In an effort to solve this problem, a memory cell of a non-volatile semiconductor device has been fabricated so that an additional transistor, (for example, a transistor of the selected gate), is further provided between a drain and a source so that the two transistors form one memory cell (i.e., a flash memory cell). Flash memory cells having two transistors in one memory cell, however, are too large, which is in direct contrast to the current trend of minimizing the chip size. Accordingly, these semiconductor devices are not widely utilized.

To solve this problem, the art recently has provided non-volatile semiconductor devices having various structures, including those known as "split gate type semiconductor devices." In these devices, a word line (i.e., the selected gate and the control gate) typically is formed on an upper part of a floating gate having electrons, and on both sidewalls of the device.

Figure 1:
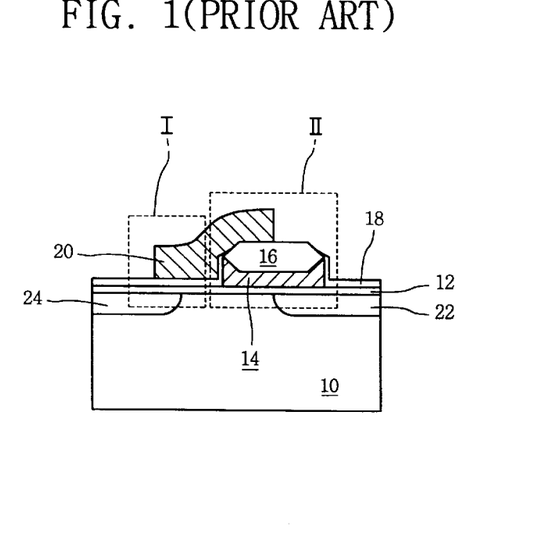
FIG. 1 is a section view showing the structure of a conventional split gate type flash memory cell.
Figure 2:
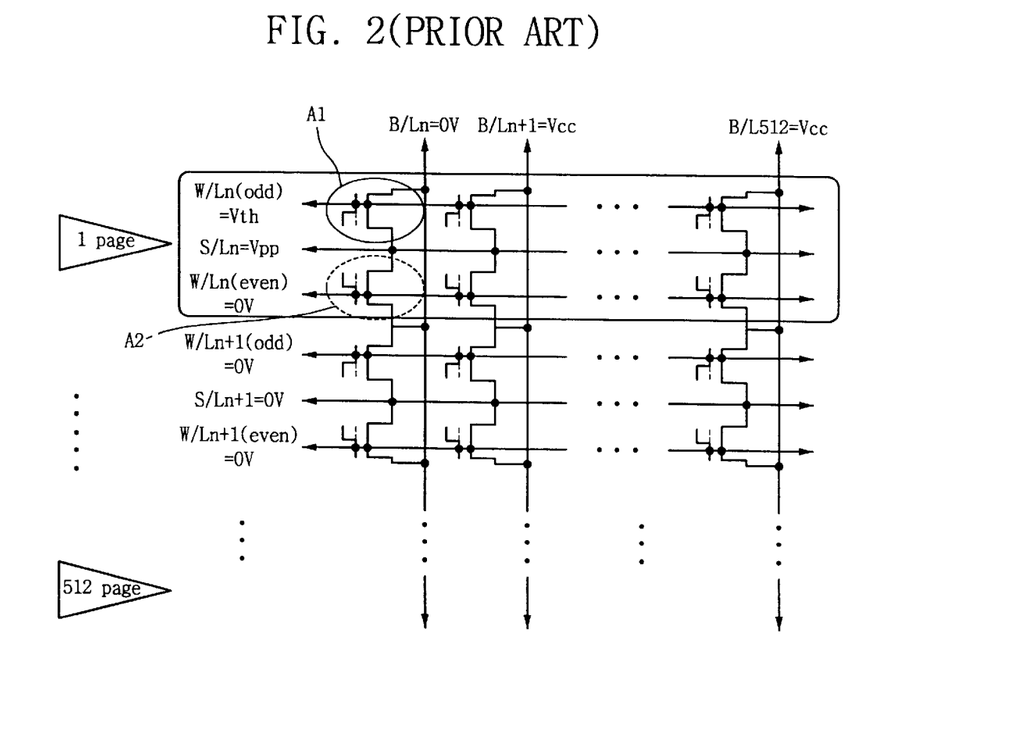
FIG. 2 is a circuit view of the structure of the entire cell array of the conventional flash memory cell shown in FIG. 1.

FIG. 1 is a section view illustrating the structure of a flash memory cell of a non-volatile semiconductor device manufactured by SST (Silicon Storage Technology Co. Ltd.). FIG. 2 is a circuit view illustrating the structure of the entire cell array of this memory cell.

With reference to FIG. 1, a conventional flash memory cell of a split gate type semiconductor device can be described structurally as follows. A floating gate 14, usually made from a polysilicon material, is formed on a predetermined part of a semiconductor substrate 10 having a gate insulating layer 12 disposed thereon. An isolation insulating layer 16 is formed on top of the floating gate 14, and a tunneling insulating layer 18 that is used for deleting data is formed on the substrate 10, which includes the isolation insulating layer 16. The tunneling insulating layer 18 also is formed on both sides of the floating gate 14.

A word line 20, usually made from a polysilicide or polycide material, then is formed on a predetermined part of the insulating layers 16 and 18. The word line 20 serves as a selected gate and a control gate. Channel regions (not shown) under the floating gate 14 and the word line 20 are connected in parallel between the source 22 and the drain 24. Thus, the memory cell is formed to operate as a selected gate transistor I and a memory gate transistor II. In this configuration, the memory cell transistor is at a high, low or negative Vth state depending upon the amount of electrons present in the floating gate 14.

Accordingly, the non-volatile semiconductor device having the thus-structured flash memory cell performs a series of operations related to storing, deleting, and reading data as follows. A program related to storing data is performed in a hot electron injection (HEI) or Fowler-Nordheim (F-N) tunnel method. Erasing, which is related to deleting data, is performed in a F-N method. The following exemplifies a case where the program is performed in a HEI method.

First, a program related to storing data will be described. If a high voltage (for example, ≡12V) is applied to a source 22 of the memory cell at a state where Vss (0V) is applied to a drain 24 through the bit line, the floating gate 14 is arranged to have a predetermined voltage due to a coupling by the voltage. If a predetermined voltage (for example, Vth) is applied to the word line 20, a channel is formed between the source 22 and the drain 24, and electrons generated in the drain 24 are injected into the floating gate 14 by the HEI method. As a result, a program is made so that data are written in the erased cell. If the voltage applied to the word line 20 is controlled appropriately, the electric field is magnified around the edge of the floating gate 14 so that the programming effect is increased and the current between the source 22 and drain 24 is decreased, thus reducing the power consumption. If the floating gate 14 is filled with electrons, however, the electrons increase the Vth level in the memory cell. Thus, if the cell is read with a reference voltage (Vref≡3 to 4V), which can be applied to the control gate of the word line 20, a channel is not formed because Vth is too high. As a consequence, current cannot flow, and only one state is memorized.

Second, a program related to erasing data and data deletion will be described. If a high voltage (for example, 15V) is applied to the word line 20 of the memory cell at a state when Vss (0V) is applied to the drain 24 and the source 22 through the bit line, electrons stored in the floating gate 14 pass through the tunnel insulating layer 18 in the F-N tunnel method. Electrons flow because of the electric field between the word line 20 and the floating gate 14, and the electrons flow off to the word line 20. As a consequence, data deletion is performed.

If the Vth level of the cell is decreased because there are no electrons in the floating gate 14, and if a reference voltage (Vref≡3 to 4V) is applied to the control gate of the word line 20 to thereby read the cell, a channel is formed in the cell because of the low Vth. Because the channel is formed, current flows and thus, the device memorizes another state which is different from the first state. Thus, data reading is performed by deciding if there is current in the transistor of the memory cell. The decision is made by applying a predetermined voltage to the bit line and word line 20 of the selected cell.

Table 1 is provided to more fully understand the conditions for the operating voltage typically required for programming, erasing, and reading operations.

TABLE 1

|  | Erase | Program | Read |
|---|---|---|---|
| Word Line | 15V | Vth | Vref |
| Drain | Vss | Vss | ≅ 2V |
| Source | Vss | ≅ 12V | Vss |

If the flash memory cell of the non-volatile semiconductor device is structured as in FIG. 1, however, program disturbance can occur when a high voltage is applied during the programming operation. This disturbance can occur because the source (S/Ln) is held in common with the selected cell A1, and because 0V is applied to the word line (W/Ln) of the non-selected cell A2 adjacent to the selected cell A1 on the same bit line (B/Ln).

In addition, if there is a defect in the tunnel insulating layer 18, a reverse tunneling disturb is generated causing a malfunction where the non-selected cell (erased cell) A2 is re-programmed. Meanwhile, a malfunction occurs if the selected gate of the word line gets shorter because of a misalignment, or if Vth of the memory cell is decreased because of defects in the method of making the device, each of which can cause a "punch-through phenomenon." The malfunction occurs where the non-selected cell (erased cell) A2 is programmed because of the punch-through disturbance.

To prevent this malfunction caused by the punch-through phenomenon, a conventional technique has been provided where the insulating layer under the selected gate of word line 20 is made thicker, which in turn increases the Vth of the selected gate. In this technique, however, because the insulating layer typically is used for the tunneling insulating layer or for the gate insulating layer of a high voltage transistor, there is a limit in how much the thickness of the layer can be increased. Accordingly, it is difficult to apply this technique to the actual process of making the semiconductor device.

A more recent technique to improve the program disturbance of the flash memory cell is to implant boron impurities under the selected gate that comprises the floating gate 14 and the word line 20 when fabricating a memory cell. Implanting the boron impurities prevents the punch-through phenomenon that occurs between the drain 24 and the source 22 when high voltage is applied to the source 22 or, as shown in FIG. 2, two word lines (W/Ln(odd), W/Ln(even)) form one page and divide the horizontal source line. Despite the advantages realized from implanting these boron impurity ions, problems arise when high voltage is applied to source 22 because, when driving the device, it is difficult to make an appropriate and accurate on/off sensing decision. The decision is difficult because the on-cell current of the non-selected cell A2 is decreased. Other problems arise when two word lines form one page because integration of the cell is decreased due to a source being formed in every page. A solution to these problems is urgently needed.

SUMMARY OF THE INVENTION

Accordingly, the present invention is directed to a non-volatile semiconductor device and to a method of making such a device that substantially obviates one or more of the problems due to the limitations and disadvantages of the related art.

A feature of the present invention therefore is to provide a non-volatile semiconductor device and a method of making such a device where the device contains an anti-punch through region surrounding the drain region of the memory cell formation part, and surrounding the source and drain regions of the low voltage transistor formation part. Such a device can reduce and/or prevent a program disturbance due to a punch-through caused in programming of a selected cell, and can ensure a predetermined amount of on-cell current thereby facilitating an appropriate and accurate on/off sensing decision. An additional feature of the present invention is to fabricate the non-volatile semiconductor device more effectively.

Additional features and advantages of the invention will be set forth in the description which follows, and in part will be apparent from the description, or may be learned by practice of the invention. The features and other advantages of the invention will be realized and attained by the structure particularly pointed out in the written description and claims hereof as well as the appended drawings.

To achieve these and other features of the present invention, as embodied and broadly described, there is provided a non-volatile semiconductor device including:

a substrate;

a memory cell formation part disposed on a predetermined part of the substrate, the memory cell formation part having at least a drain region;

a peripheral circuit part disposed on a predetermined part of the substrate, the peripheral circuit part having a high-voltage transistor formation part and a low-voltage transistor formation part, wherein each high-voltage transistor formation part and low-voltage transistor formation part includes at least a source and a drain region; and an anti-punch through region surrounding: (a) the drain region in the memory cell formation part; and (b) the drain and source region of the low-voltage transistor formation part.

In accordance with an additional feature of the invention, there is provided a method of making a non-volatile semiconductor device including:

providing an insulating substrate comprising a memory cell formation part and a peripheral circuit part having a high-voltage transistor formation part and a low-voltage transistor formation part;

successively forming a semiconductor layer and a random layer on the insulating substrate;

etching a predetermined portion of the random layer to expose a predetermined portion of the surface of the semiconductor layer in the memory cell formation part;

selectively implanting impurity ions into the exposed surface of the semiconductor layer to thereby form a conductor in a specific part of the semiconductor layer;

forming an isolation insulating layer having edges on the memory cell formation part using the etched random layer as a mask;

removing the etched random layer;

forming a floating gate having at least two sidewalls by etching the semiconductor layer by using the isolation insulating layer as a mask;

forming an insulating layer having a predetermined thickness on the substrate including the edges of the isolation insulating layer and the sidewalls of the floating gate to form an insulating layer surface;

forming a conductive layer on the insulating layer surface;

selectively etching a predetermined part of the conductive layer to form: (a) a word line having sidewalls in the memory cell formation part; and (b) a gate having edges in the high and low-voltage transistor formation parts in the peripheral circuit part;

selectively implanting first conductivity type impurity ions into the memory cell formation part of the substrate where the word line is not formed and overlapping a predetermined portion of the floating gate, thereby forming a source region in the memory cell formation part of the substrate;

selectively implanting first conductivity type impurity ions into the high-voltage transistor formation part in the peripheral circuit part thereby forming a first lightly doped drain (LDD) region in the substrate on the edges of the gate in the high-voltage transistor formation part;

selectively implanting first conductivity type impurity ions into the low-voltage transistor formation part, and into the memory cell formation part to thereby form: (a) a second LDD region in the substrate overlapping with a predetermined portion of the word line; and (b) a third LDD region in the substrate on the edges of the gate in the low-voltage transistor formation part;

tilt-implanting second conductivity type impurity ions into the low-voltage transistor formation part, and into the memory cell formation part to thereby form an anti-punch through region surrounding the second and third LDD regions in the substrate;

forming a spacer on: (a) the sidewalls of the word line; (b) one sidewall of the floating gate; and (c) the edges of the gate in the high and low-voltage transistor formation parts; and implanting first conductivity type impurity ions into the substrate thus forming a drain region in the memory cell formation part, and source and drain regions in each of the high and low-voltage transistor formation parts.

The thus-structured non-volatile semiconductor device of the present invention improves the punch-through characteristic of the non-selected cell by using the anti-punch through region. The device of the invention provides these improved characteristics even when the channel becomes short or Vth is decreased due to defects in the method of making the device. Thus, when programming the selected cell, the invention prevents the programming of a non-selected cell by the punch-through phenomenon. In addition, when reading the selected cell, the invention ensures a predetermined amount of on-cell current suitable for making an appropriate and accurate on/off sensing decision.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Korean patent application No. 98-27833 filed on Jul. 10, 1998 and entitled "Non-Volatile Semiconductor Device and its Fabricating Method" is incorporated by reference herein in its entirety. Reference will now be made in detail to the preferred embodiments of the present invention, examples of which are illustrated in the accompanying drawings. In the drawings, like reference numerals denote like embodiments.

In a non-volatile semiconductor device, preferably, a MOSFET having a flash memory cell, the invention ensures a predetermined amount of on-cell current thereby facilitating an appropriate and accurate on/off sensing decision. The invention also prevents program disturbances caused by a punch-through phenomenon by modifying the structure of a drain in the memory cell formation part, and by modifying the structure of a source in the low voltage transistor formation part.

The present invention is directed to a non-volatile semiconductor device, preferably a MOSFET type device including:

a substrate, preferably an insulating substrate;

a memory cell formation part disposed on a predetermined part of the substrate, the memory cell formation part preferably having a flash memory cell transistor, and wherein the memory cell formation part has at least a drain region;

a peripheral circuit part disposed on a predetermined part of the substrate, preferably a part that is different from the predetermined part of the substrate including the memory cell formation part, the peripheral circuit part having a high-voltage transistor formation part and a low-voltage transistor formation part wherein each high-voltage transistor formation part and low-voltage transistor formation part includes at least a source and a drain region; and an anti-punch through region surrounding: (a) the drain region in the memory cell formation part; and (b) the drain and source region of the low-voltage transistor formation part.

The invention also provides a method of making a non-volatile semiconductor device including:

providing an insulating substrate comprising a memory cell formation part, preferably having a flash memory cell transistor, and a peripheral circuit part having a high-voltage transistor formation part and a low-voltage transistor formation part;

successively forming a semiconductor layer and a random layer on the insulating substrate;

etching a predetermined portion of the random layer to expose a predetermined portion of the surface of the semiconductor layer in the memory cell formation part;

selectively implanting impurity ions into the exposed surface of the semiconductor layer to thereby form a conductor in a specific part of the semiconductor layer;

forming an isolation insulating layer having edges on the memory cell formation part using the etched random layer as a mask;

removing the etched random layer;

forming a floating gate having at least two sidewalls by etching the semiconductor layer by using the isolation insulating layer as a mask;

forming an insulating layer having a predetermined thickness on the substrate including the edges of the isolation insulating layer and the sidewalls of the floating gate to form an insulating layer surface;

forming a conductive layer on the insulating layer surface;

selectively etching a predetermined part of the conductive layer to form: (a) a word line having sidewalls in the memory cell formation part; and (b) a gate having edges in the high and low-voltage transistor formation parts in the peripheral circuit part;

selectively implanting first conductivity type impurity ions, preferably heavily doped impurity ions, into the memory cell formation part of the substrate where the word line is not formed and overlapping a predetermined portion of the floating gate, thereby forming a source region in the memory cell formation part of the substrate;

selectively implanting first conductivity type impurity ions, preferably lightly doped impurity ions, into the high-voltage transistor formation part in the peripheral circuit part thereby forming a first lightly doped drain (LDD) region in the substrate on the edges of the gate in the high-voltage transistor formation part;

selectively implanting first conductivity type impurity ions, preferably lightly doped impurity ions, into the low-voltage transistor formation part, and into the memory cell formation part to thereby form: (a) a second LDD region in the substrate overlapping with a predetermined portion of the word line; and (b) a third LDD region in the substrate on the edges of the gate in the low-voltage transistor formation part;

tilt-implanting second conductivity type impurity ions, preferably lightly doped impurity ions, into the low-voltage transistor formation part, and into the memory cell formation part to thereby form an anti-punch through region surrounding the second and third LDD regions in the substrate;

forming a spacer on: (a) the sidewalls of the word line; (b) one sidewall of the floating gate; and (c) the edges of the gate in the high and low-voltage transistor formation parts; and implanting first conductivity type impurity ions, preferably heavily doped impurity ions, into the substrate thus forming a drain region in the memory cell formation part, and source and drain regions in each of the high and low-voltage transistor formation parts.

The respective layers of the present invention can be formed using any technique known in the art. Those skilled in the art are capable of successively depositing (i.e. forming) and etching layers on an insulating substrate using methods known in the art. For example, layers can be deposited (or formed) using various deposition techniques, like random metallization, chemical vapor deposition (CVD), plasma deposition, and the like. Selective etching also can be effected using, for example, photoresist compositions and masks.

Any impurity ions can be used in the present invention. Impurity ions include those of a first conductivity type, preferably n-type, and those of a second conductivity type, preferably p-type. Heavily doped first conductivity type impurity ions preferably denotes a higher proportion of impurity ions than lightly doped first conductivity impurity ions. Those skilled in the art are capable of carrying out the invention using any type of impurity ions, as well as heavily and lightly doped conductivity type impurity ions, using the guidelines provided herein.

FIGS. 13 to 16 illustrate a method of making a non-volatile semiconductor device of the invention. With reference to the drawings, the method of making the non-volatile semiconductor device will be described in the following procedures. Those skilled in the art will appreciate that some of the procedures can be combined into a single procedure and that additional procedures can be employed. In addition, skilled artisans will appreciate that providing a substrate, preferably an insulating substrate, having a memory cell formation part and a peripheral circuit formation part (having a high-voltage transistor formation part and a low-voltage transistor formation part) can be accomplished by reference to FIGS. 3–6 and the accompanying text below. In the drawings: a memory cell formation part of the device is denoted as "A"; a high-voltage transistor formation part in the peripheral circuit formation part is denoted as "B"; and a low-voltage transistor formation part in the peripheral circuit formation part is denoted as "C."

Figure 3:
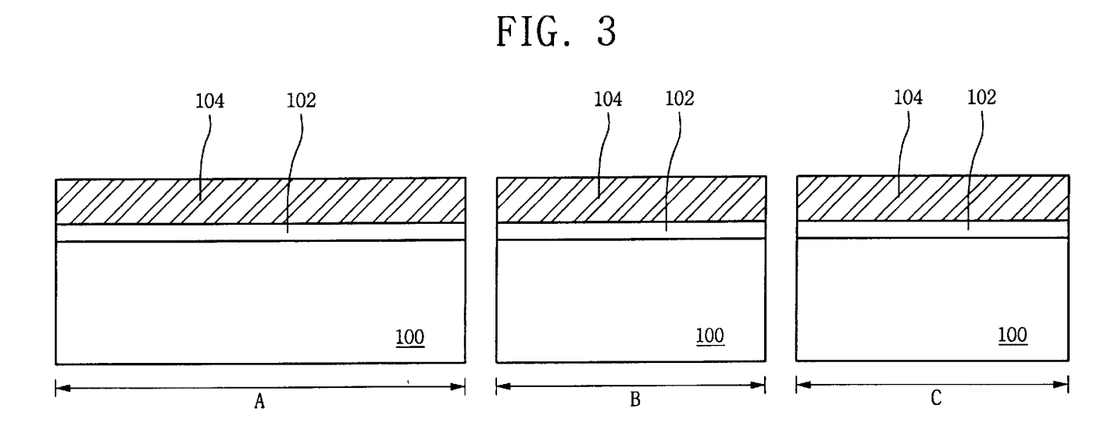
FIGS. 3 to 16 illustrate process procedures involved in a method of fabricating a nonvolatile semiconductor device employing a split gate type flash memory cell of the invention.

FIG. 3 illustrates a procedure whereby a first insulating layer 102, preferably made of a thermal oxidation layer material, can be formed on a semiconductor substrate (for example, a silicon substrate) 100. An anti-oxide layer 104, preferably made of a nitride, i.e., "SiN," layer material then can be formed thereon. As noted above, forming the respective layers can be accomplished by means known in the art such as by random metallization, chemical vapor deposition, plasma deposition, and the like.

Figure 4:
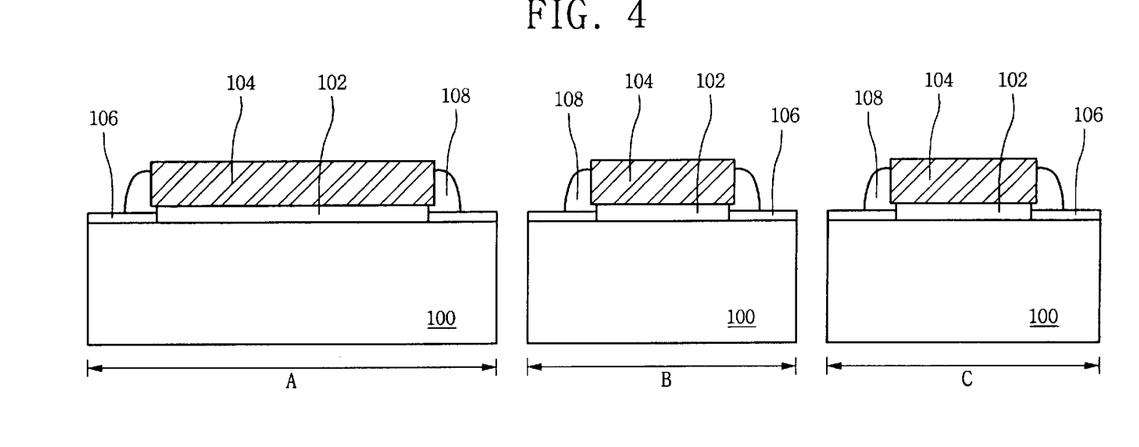

FIG. 4 illustrates a procedure whereby a photoresist pattern (not shown) is formed on the anti-oxide layer 104 to define an active region on the device. The anti-oxide layer 104 can be etched by using the photoresist pattern as a mask, and then the photoresist pattern can be removed thereby exposing sidewalls of anti-oxide layer 104. Thereafter, using the etched anti-oxide layer 104 as a mask, the first insulating layer 102 can be undercut in a predetermined part by using an etching process. On the exposed surface of the substrate 100, a second insulating layer 106 can be formed. The second insulating layer 106 preferably is made of a thermal oxidation layer and preferably is thinner than the first insulating layer 102. A polysilicon layer (or oxide layer) then can be formed on the overall surface of the above layer, and anisotropically dry-etched to form a spacer 108, preferably made of a polysilicon (or oxide) layer, on the sidewalls of the anti-oxide layer 104.

Figure 5:
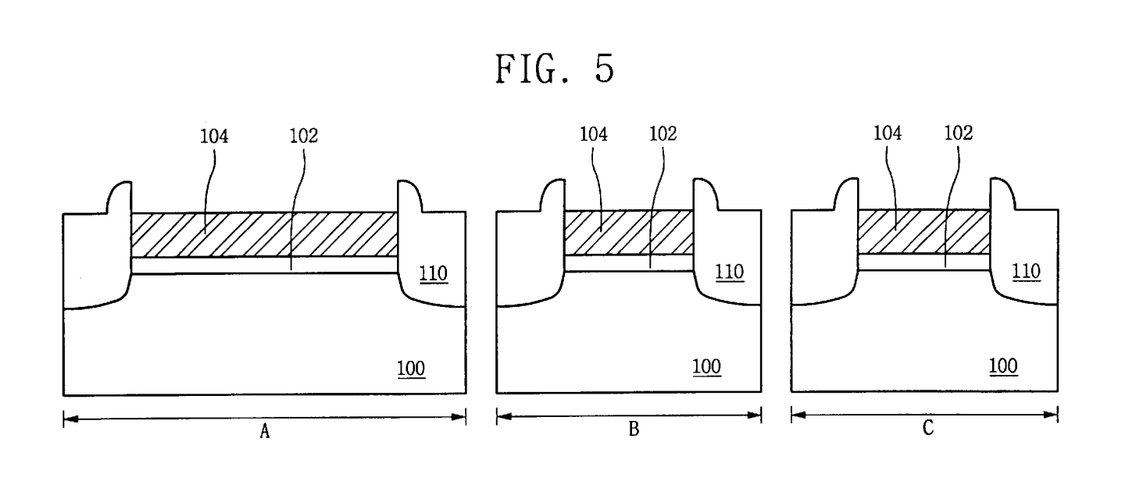

FIG. 5 illustrates forming a field oxide layer 110 in a device isolation region on the substrate 100. The field oxide layer 110 can be formed by oxidizing the spacer 108, the second insulating layer 106, and a part of the silicon substrate 100 using the anti-oxide layer 104 as a mask.

Figure 6:
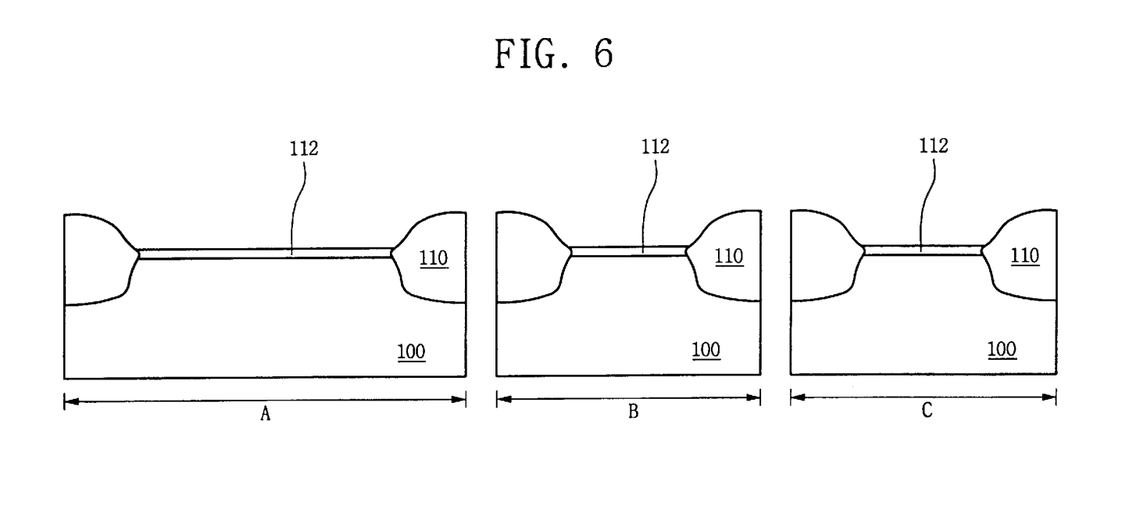

FIG. 6 illustrates removing the anti-oxide layer 104 and the first insulating layer 102 to expose a surface of the active region on the substrate 100. A buffer oxide layer 112 then can be formed on the exposed surface of the substrate 100. Ion implantation then can be successively performed in order to form a well, a field, and a control Vth level (not shown). Those skilled in the art are capable of forming a well, a field and a control Vth level using ion implantation, given the guidelines provided herein.

Figure 7:
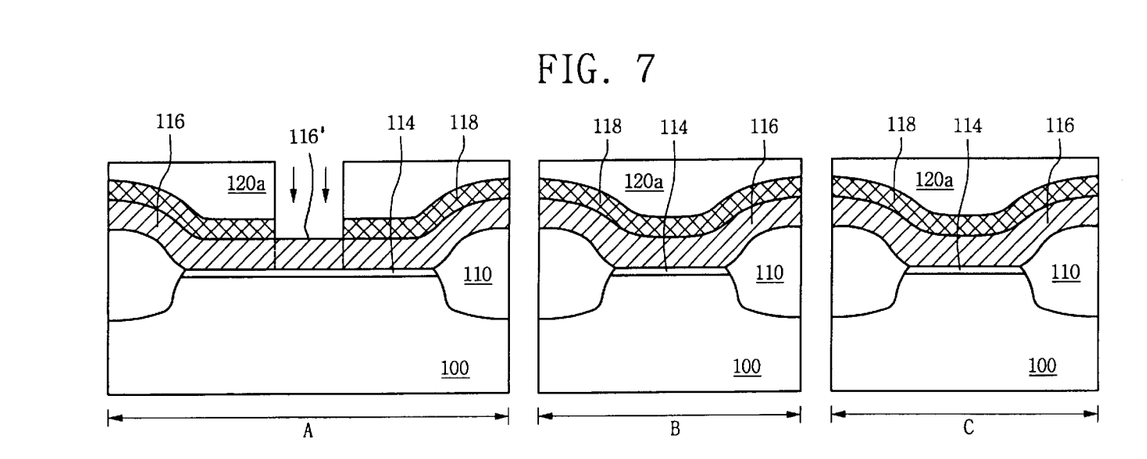

FIG. 7 illustrates removing the buffer oxide layer 112. A third oxide layer 114 serving as a gate insulating layer, can be formed on the surface of the substrate 100 where the buffer oxide layer 112 was removed. A semiconductor layer 116, preferably made of pure polysilicon substantially without impurity ions (i.e., undoped polysilicon), or made of amorphous silicon material, can be formed on the third insulating layer 114 including the field oxide layer 110. A random layer 118, preferably made of a nitride layer material, (i.e., "SiN") can be formed thereon. Thereafter, in order to expose a surface of the random layer 118 in the floating gate formation part, (the floating gate formation part described below), a photoresist pattern 120a preferably is formed on the random layer 118.

Figure 8:
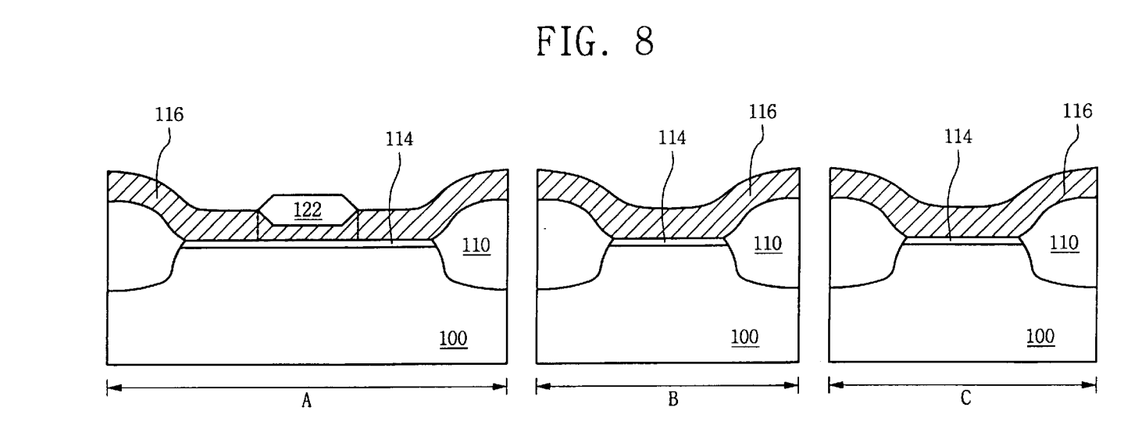

FIG. 7 illustrates a procedure whereby the random layer 118 is etched to thereby expose a predetermined surface of the semiconductor layer 116 of the memory cell formation part A by using the photoresist pattern 120a as a mask. Impurity ions then can be implanted into the exposed surface of the semiconductor device to thereby form a conductor 116' in the semiconductor layer 116 (the conductor is denoted by the portion of semiconductor layer 116 inside the dotted vertical lines in part A of the drawing). Thereafter, impurity ions for controlling the Vth can be implanted into the surface of the substrate 100 under the conductor 116' in order to control the threshold voltage, and to increase the Vth level of the next floating gate. The photoresist pattern 120a then can be removed. Referring to FIG. 8, in an oxide process using the etched random layer 118 as a mask, the semiconductor layer 116 then preferably is oxidized to a predetermined thickness to selectively form an isolation insulating layer 122 having edges on the memory cell formation part "A".

Figure 9:
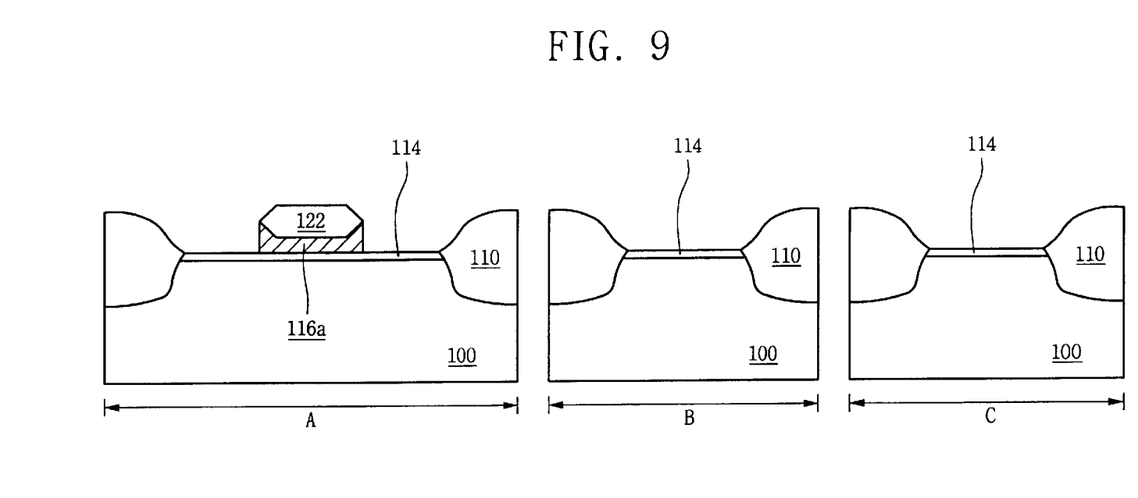

FIG. 9 illustrates dry-etching the semiconductor layer 116 by using the isolation insulating layer 122 as a mask so that a floating gate 116a having sidewalls is formed in the memory cell formation part "A". Here, the floating gate 116a preferably is the conductor 116' formed from the semiconductor layer.

Figure 10:
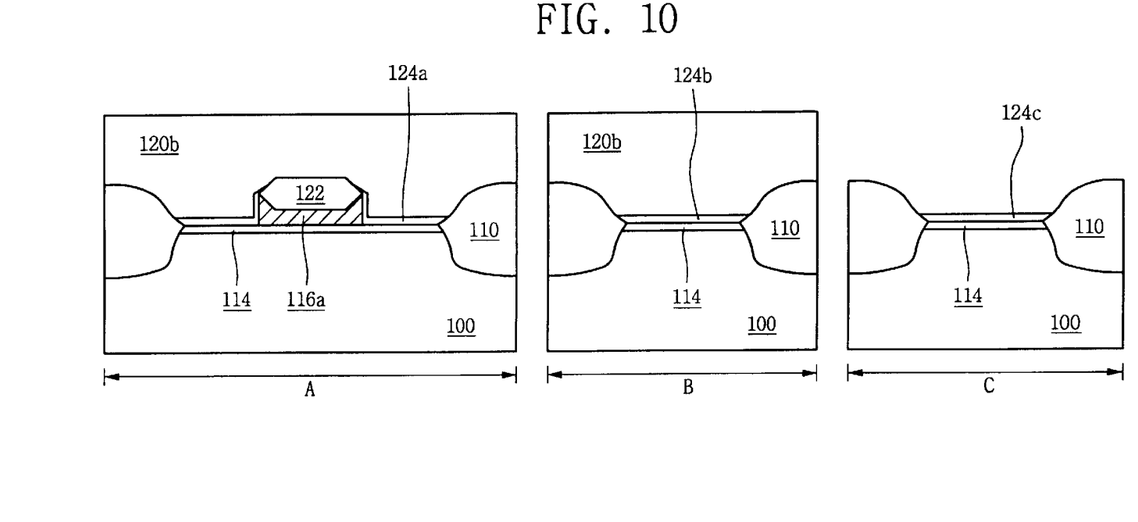

FIG. 10 illustrates a procedure for forming fourth insulating layers 124a, 124b and 124c, preferably having a thickness of up to about 50 Å, on the third insulating layer 114 including the edges of the isolation insulating layer 122 and the sidewalls of the floating gate 116a. The fourth insulating layers 124a, 124b, and 124c serve to insulate the floating gate 116a from a subsequent word line to form a gate insulating layer of a transistor. The fourth insulating layer 124a, 124b and 124c preferably are single-layered structures comprised of thermal oxidation layers, or are single-layered structures comprised of a chemical vapor deposited (CVD) oxide layer material, or are multi-layered structures comprised of any combination of the single layers. A photoresist pattern 120b then can be formed on the overall surface, excluding the fourth insulating layer 124c in the low-voltage transistor formation part "C".

Figure 11:
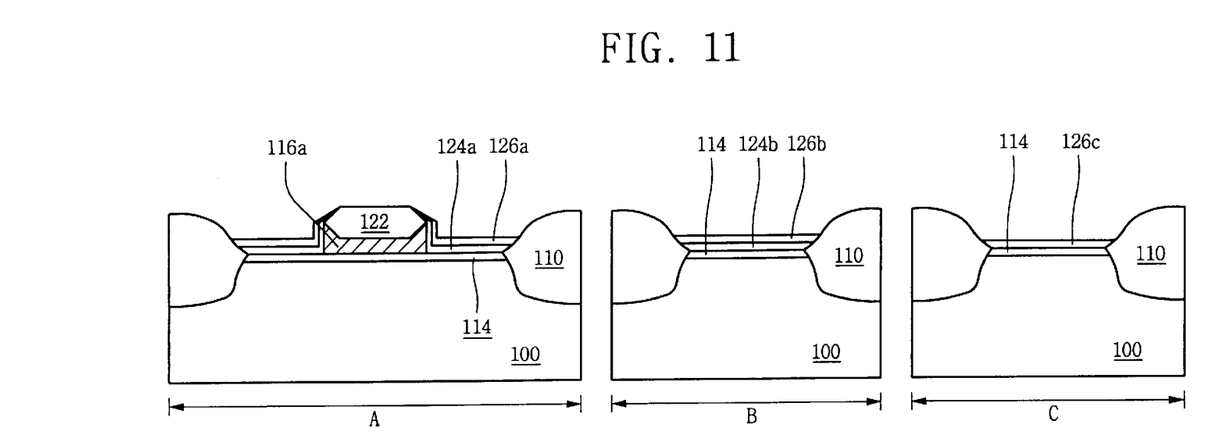
Figure 12:
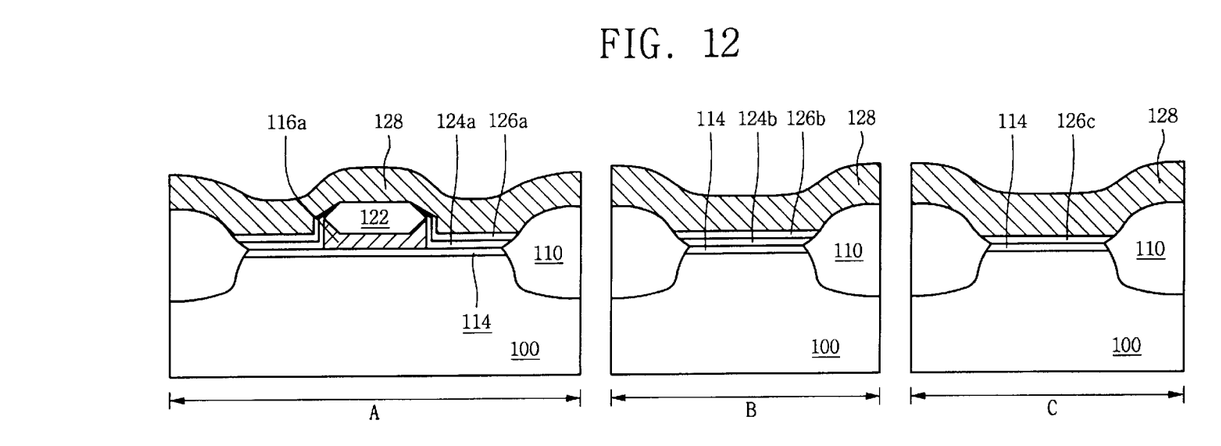

FIG. 11 illustrates etching the fourth insulating layer 124c of the low-voltage transistor formation part "C" by using the photoresist pattern 120b as a mask. The photoresist pattern 120b then can be removed. Thereafter, fifth insulating layers 126a, 126b and 126c can be formed, preferably having a thickness of up to about 100 Å, on top of the fourth insulating layers 124a and 124b in the memory cell formation part "A" and in the high-voltage transistor formation part "B," respectively, and on top of the third insulating layer 114 in the low-voltage transistor formation part "C". The fifth insulating layer preferably is made of a thermal oxidation layer. As a result, in the memory cell formation part "A," a tunneling insulating layer made of the fourth and fifth insulating layers 124a and 126a is formed on the third insulating layer 114. Fourth and fifth insulating layers 124a and 126a preferably function as gate insulating layers. In the high-voltage transistor formation part "B," a gate insulating layer is formed which is comprised of the third to the fifth insulating layers 114, 124b and 126b. In the low-voltage transistor formation part "C," a gate insulating layer is formed, which is comprised of the third and fifth insulating layers 114 and 126c. The resulting exposed surface shown in FIG. 11 can be referred to as an insulating layer surface FIG. 12 illustrates forming a conductive layer 128, preferably comprised of a polysilicon or polycide material (i.e., a silicide on doped polysilicon), on the overall exposed surface of the resulting substrate (the insulating layer surface). The conductive layer 128 is formed in order to form a word line in the memory cell formation part "A" and to form a gate in the high-voltage and low-voltage transistor formation parts "B" and "C."

Figure 13:
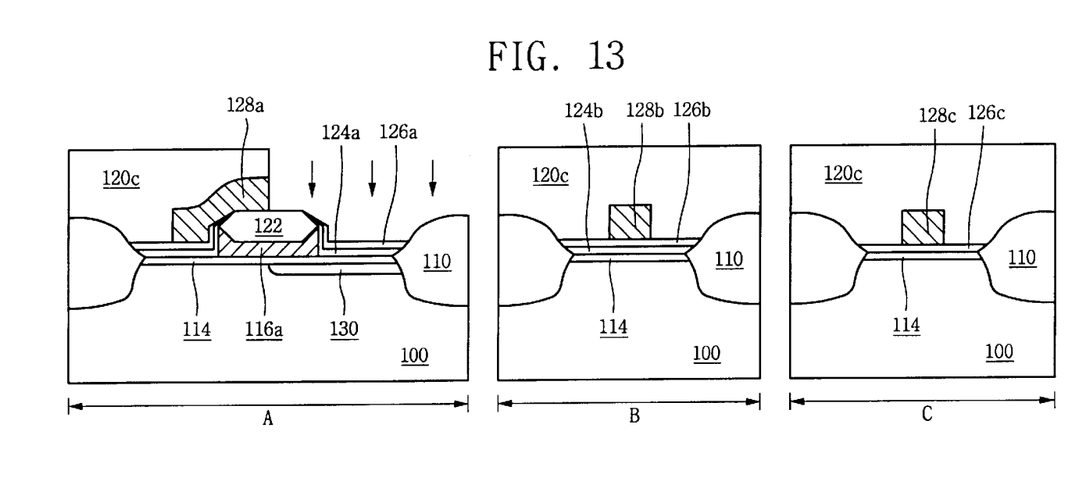

FIG. 13 illustrates dry-etching the conductive layer 128 by using a photoresist pattern (not shown) as a mask, defining parts of the word line and the gate of the transistor. Dry-etching conductive layer 128 forms a word line 128a, made of a conductive layer, which functions as a selected gate and a control gate in the memory cell formation part "A." In addition, gates 128b and 128c, each having edges and preferably also made of a conductive layer material, are formed in the high and low-voltage transistor formation parts "B" and "C." The photoresist pattern then can be removed. In order to form a common source line in the memory cell formation part "A," a photoresist pattern 120c then can be formed on the overall surface of the above substrate in the memory cell formation part "A." The photoresist pattern 120c exposes the surface of the isolation insulating layer 122 on the side where the word line 128a is not formed, and exposes the surface of the fifth insulating layer 126a which is adjacent to the isolation insulating layer 122. Using the photoresist pattern 120c as a mask, a first conductivity type (for example, n type) impurity ion, preferably heavily doped first conductivity type impurity ions, can be implanted into the substrate. A thermal treatment then can be performed so that a source region 130 is formed in the substrate 100 of the memory cell formation part "A."

Figure 14:
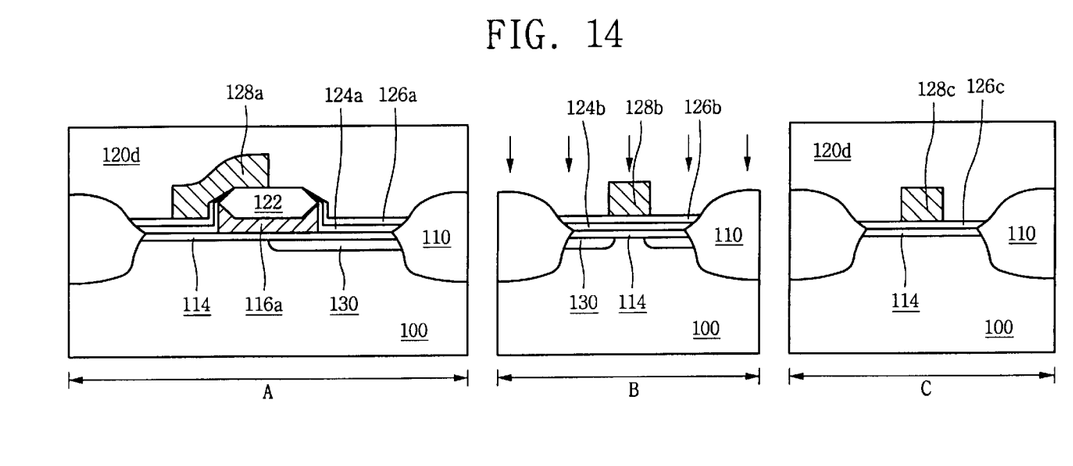

FIG. 14 shows a procedure whereby the photoresist pattern 120c is removed and another photoresist pattern 120d is formed on the overall surface of the substrate excluding the high-voltage transistor formation part "B". A first conductivity type (for example, n type) impurity ion, preferably lightly doped first conductivity type impurity ions, then can be implanted into the substrate 100 by using the photoresist pattern 120d as a mask. As a result, a first LDD (lightly doped drain) region 130 is formed on the substrate 100 on the edges of the gate 128b in the high-voltage transistor formation part "B".

Figure 15:
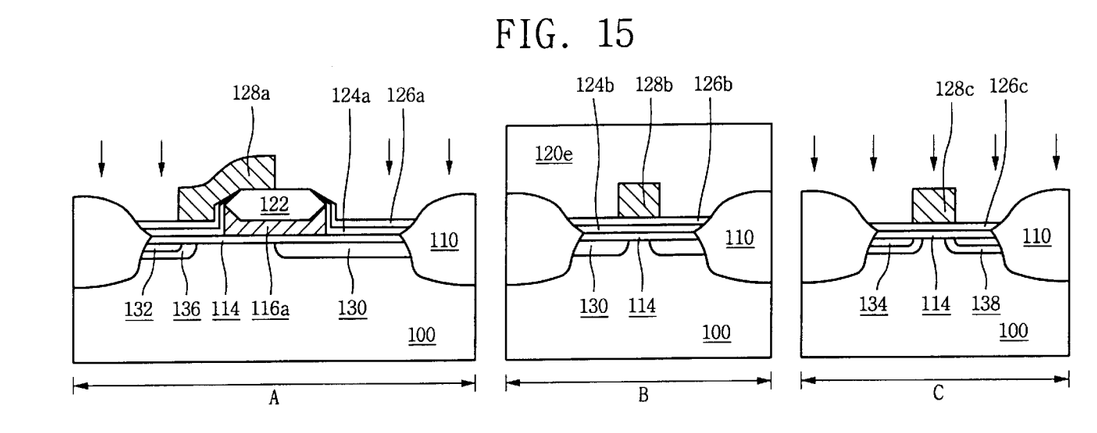

FIG. 15 shows a procedure whereby the photoresist pattern 120d is removed and another photoresist pattern 120e is formed on the overall surface of the substrate excluding the memory cell formation part "A" and the low-voltage transistor formation part "C." A first conductivity type (for example, n type) impurity ion, preferably lightly doped first conductivity type impurity ions, then can be implanted into the substrate 100. As a result, a second LDD (lightly doped drain) region 132 is formed on the substrate 100 on the side of the word line 128a (i.e., selection gate) in the memory cell formation part "A" and the third LDD region 134 is formed on the substrate 100 on both edges of the gate 128c in the low-voltage transistor formation part "C." Thereafter, to prevent the punch-through phenomenon, a second conductivity type impurity ion (for example, p type), preferably lightly doped second conductivity type impurity ions, is tilt-implanted into the substrate 100 and the photoresist pattern 120e is removed. This lightly doped second conductivity type impurity ion preferably is opposed to the lightly doped first conductivity type impurity ions that are included in the first to third LDD regions 130, 132 and 134, respectively. As a result, the second LDD region 132 in the memory cell formation part and the third LDD region 134 in the low-voltage transistor formation part "C" are surrounded by anti-punch through regions 136 and 138, respectively. Preferably, anti-punch through regions 136 and 138 have a halo-structure. Skilled artisans are capable of tilt-implanting a second conductivity type impurity ion into substrate 100 using the guidelines provided herein.

Figure 16:
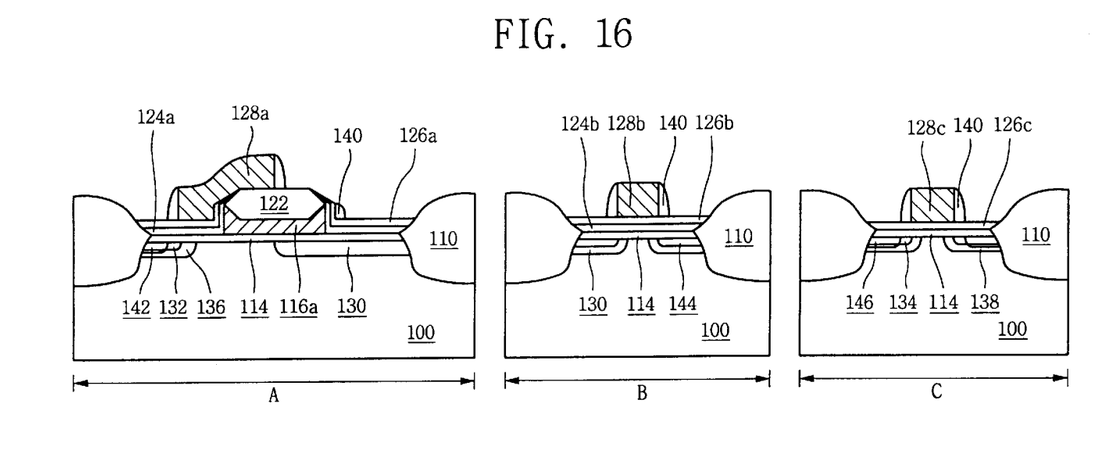

FIG. 16 shows a procedure whereby the photoresist pattern 120e is removed and a sixth insulating layer, preferably comprised of an oxide (or nitride) layer material, is formed thereon. The sixth insulating layer then can be anisotropically dry-etched so that a spacer 140, preferably comprised of an oxide layer or nitride layer material, then can be formed on: (a) sidewalls of the word line 128a in the memory cell formation part "A"; (b) one sidewall of the floating gate 116a; and (c) both sidewalls of the gates 128b and 128c in the high and low-voltage transistor formation parts "B" and "C." Thereafter, a first conductivity type (for example, n type) impurity ion, preferably heavily doped first conductivity type impurity ions, is implanted into the substrate 100 including the above so that a drain region 142 is formed in the memory cell formation part "A," and source and a drain regions, 144 and 146 are formed individually in the high and low-voltage transistor formation parts "B" and "C," respectively. This completes the process of making the non-volatile semiconductor device of the present invention.

In the non-volatile semiconductor device of the invention, the drain 142 in the memory cell formation part "A" is placed inside the second LDD region 132 and the anti-punch through region 136. The source and drain regions 146 in the low-voltage transistor formation part "C" also are placed inside the third LDD region 134 and anti-punch through region 138. Finally, the source and drain regions 144 in the high-voltage transistor formation part "B" are placed inside the first LDD region 130. As a result, the non-volatile semiconductor device is completed, in which the drain 142 in the memory cell formation part "A" and the source and drain regions 146 in the low-voltage transistor formation part "C" are surrounded by the anti-punch through regions 136 and 138, respectively. Preferably, anti-punch through regions 136 and 138 have a halo-structure.

As a preferred example, the present invention has been described where the high and low-voltage transistors are NMOS. The invention can be applied, however, when the high and low-voltage transistor are PMOS.

With the thus-structured non-volatile semiconductor device, the invention can maximally reduce, or even eliminate, the punch-through phenomenon by virtue of the anti-punch through region which is comprised of impurity ions of a type opposed to the impurity ions in the drain region. The invention also prevents a malfunction which can occur when programming the selected cell whereby the non-selected cell (erased cell) is programmed by a punch-through disturbance. The invention can achieve these effects even though the Vth of the memory cell transistor is decreased because of the short channel caused by a mis-aligning in forming the word line (specifically, selection gate), or because of defects that may occur during its manufacture. Furthermore, in contrast to the conventional device where impurity ions are implanted entirely under the floating gate and the selection gate to increase the Vth, an on/off sensing decision is easier with the present invention when reading the selected cell because the on-cell current is increased. More specifically, when reading the selected cell, the invention ensures a predetermined amount of on-cell current thereby ensuring an accurate and appropriate on/off sensing decision.

It will be apparent to those skilled in the art that various modifications and variations can be made in the non-volatile semiconductor device and its fabricating method of the present invention without departing from the spirit or scope of the invention. Thus, it is intended that the present invention cover the modifications and variations of this invention provided they come within the scope of the appended claims and their equivalents.

I claim:

1. A non-volatile semiconductor device comprising:
a substrate;
a memory cell formation part disposed on a predetermined part of the substrate, the memory cell formation part comprising at least a drain region, a first lightly doped drain region, a second lightly doped drain region, a source region, a floating gate and a word line;
a peripheral circuit part disposed on a predetermined part of the substrate, the peripheral circuit part comprising a high-voltage transistor formation part and a low-voltage transistor formation part wherein the high-voltage transistor formation part comprises at least a source region, a drain region, a first lightly doped drain region and a gate region with sidewall spacers and the low-voltage transistor formation part comprises at least a source region, a drain region, a third lightly doped drain region and a gate region with sidewall spacers; and
anti-punch through regions surrounding only: (a) the drain and the second lightly doped drain regions of the memory cell formation part; and (b) the drain, the source and the third lightly doped drain regions of the low-voltage transistor formation part.

2. The device as claimed in claim 1, wherein the anti-punch through regions, the drain and the second lightly doped drain regions of the memory cell formation part, the source, the drain and the first lightly doped drain regions of the high-voltage transistor formation part and the source, the drain and the third lightly doped drain regions of the low-voltage transistor formation part are each doped with impurity ions, wherein the impurity ions of the anti-punch through regions are of a type opposite to that of the source, the drain and the first, second and third lightly doped drain regions.

* * * * *